United States Patent
Park et al.

(10) Patent No.: US 9,997,670 B2
(45) Date of Patent: Jun. 12, 2018

(54) SEMICONDUCTOR LIGHT EMITTING DEVICE PACKAGE

(71) Applicant: Samsung Electronics Co., Ltd., Suwon-si (KR)

(72) Inventors: Ki Won Park, Suwon-si (KR); Yong Min Kwon, Seoul (KR); Hyung Kun Kim, Suwon-si (KR); Dong Kuk Lee, Suwon-si (KR); Dae Yeop Han, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/410,033

(22) Filed: Jan. 19, 2017

(65) Prior Publication Data

US 2017/0365739 A1    Dec. 21, 2017

(30) Foreign Application Priority Data

Jun. 21, 2016  (KR) ........................ 10-2016-0077293

(51) Int. Cl.
*H01L 33/22* (2010.01)
*H01L 33/06* (2010.01)
(Continued)

(52) U.S. Cl.
CPC ............ *H01L 33/22* (2013.01); *H01L 27/153* (2013.01); *H01L 33/06* (2013.01); *H01L 33/325* (2013.01); *H01L 33/38* (2013.01); *H01L 33/505* (2013.01); *H01L 33/54* (2013.01); *H01L 33/62* (2013.01); *H01L 33/0025* (2013.01);
(Continued)

(58) Field of Classification Search
None
See application file for complete search history.

(56) References Cited

U.S. PATENT DOCUMENTS 6,287,950 B1 * 9/2001 Wu ........................ H01L 24/03
257/E21.508
6,372,608 B1    4/2002 Shimoda et al.
(Continued)

FOREIGN PATENT DOCUMENTS

JP    2011-238744    11/2011
KR    2005-0000197 A    1/2005
(Continued)

*Primary Examiner* — Whitney T Moore
(74) *Attorney, Agent, or Firm* — Muir Patent Law, PLLC

(57) ABSTRACT

A semiconductor light emitting device package includes a light emitting structure having a first conductive semiconductor layer, an active layer, a second conductive semiconductor layer, a first surface, and a second surface, a first electrode and a second electrode disposed on the second surface of the light emitting structure; an insulating layer, a first metal pad and a second metal pad disposed on the insulating layer, and each having a surface with a first fine uneven pattern so as to have a first surface roughness, a first bonding pad and a second bonding pad disposed on the first metal pad and the second metal pad, respectively, and each having a surface with a second fine uneven pattern so as to have a second surface roughness, and an encapsulant encapsulating the first bonding pad, the second bonding pad, the first metal pad, and the second metal pad.

20 Claims, 15 Drawing Sheets

(51) Int. Cl.
  *H01L 33/32* (2010.01)
  *H01L 33/62* (2010.01)
  *H01L 33/54* (2010.01)
  *H01L 33/50* (2010.01)
  *H01L 33/38* (2010.01)
  *H01L 27/15* (2006.01)
  *H01L 33/00* (2010.01)

(52) U.S. Cl.
  CPC .... *H01L 33/0075* (2013.01); *H01L 2933/005* (2013.01); *H01L 2933/0016* (2013.01); *H01L 2933/0041* (2013.01)

(56) References Cited

U.S. PATENT DOCUMENTS

| | | | |
|---|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,541,206 B2 | 6/2009 | Yoon et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,344,412 B2 | 1/2013 | Hsu et al. |
| 8,368,114 B2 | 2/2013 | Yang |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,686,456 B2 | 4/2014 | Jeong |
| 8,735,931 B2 | 5/2014 | Han et al. |
| 8,766,295 B2 | 7/2014 | Kim |
| 8,957,450 B2 | 2/2015 | Sugizaki |
| 9,070,844 B2 | 6/2015 | Kimura et al. |
| 2004/0256631 A1 | 12/2004 | Shin |
| 2013/0285101 A1* | 10/2013 | Sugizaki ............ H01L 33/0079 257/98 |
| 2015/0109803 A1 | 4/2015 | Park et al. |
| 2015/0357517 A1 | 12/2015 | Chen et al. |

FOREIGN PATENT DOCUMENTS

| | | |
|---|---|---|
| KR | 2012-0044739 A | 5/2012 |
| KR | 2013-0010246 A | 1/2013 |
| KR | 2015-0012729 A | 2/2015 |
| KR | 2015-0033478 A | 4/2015 |

* cited by examiner

SEMICONDUCTOR LIGHT EMITTING DEVICE PACKAGE

CROSS-REFERENCE TO RELATED APPLICATION

This application claims benefit of priority to Korean Patent Application No. 10-2016-0077293, filed on Jun. 21, 2016, with the Korean Intellectual Property Office, the disclosure of which is incorporated herein by reference in its entirety.

BACKGROUND

1. Field

The herein described subject matter relates to a semiconductor light emitting device package.

2. Background

When current is applied to a semiconductor light emitting device, the semiconductor light emitting device emits light using the recombination principle of electrons and holes. Such semiconductor light emitting devices are widely used as light sources due to various advantages thereof, such as low power consumption, a high degree of brightness, and compact size. In particular, since nitride-based light emitting devices have been developed, the extent of the use of semiconductor light emitting devices has been expanded and semiconductor light emitting devices have been employed in light source modules, home lighting fixtures, vehicle lighting, and the like.

With the increased use of semiconductor light emitting devices, applications for these devices have expanded to encompass high-current/high-output light source fields. Accordingly, research into improvements for such applications and into the reliability of semiconductor light emitting device packages have continued in the related art.

SUMMARY

An aspect of the present embodiments described herein may provide a semiconductor light emitting device package having improved reliability.

According to an example embodiment, A semiconductor light emitting device package may include: a light emitting structure having a sequentially layered structure including a first conductive semiconductor layer, an active layer, and a second conductive semiconductor layer, and having a first surface comprising a surface of the first conductive semiconductor layer, and a second surface opposite the first surface, a first electrode and a second electrode disposed on the second surface of the light emitting structure, and connected to the first conductive semiconductor layer and the second conductive semiconductor layer, respectively, an insulating layer covering at least parts of the second surface of the light emitting structure, the first electrode, and the second electrode, a first metal pad and a second metal pad disposed on the insulating layer, the first metal pad being electrically connected to the first electrode and the second metal pad being connected to the second electrode through respective openings of the insulating layer, each of the first metal pad and the second metal pad having a patterned surface with a surface roughness at least as great as a first surface roughness, a first bonding pad and a second bonding pad disposed on the first metal pad and the second metal pad, respectively, and each having a patterned surface with a surface roughness at least as great as a second surface roughness, and an encapsulant encapsulating the first bonding pad, the second bonding pad, the first metal pad, and the second metal pad such that portions of the first bonding pad and the second bonding pad are exposed.

According to another example embodiment, a semiconductor light emitting device package may include: a light emitting structure having a sequentially layered structure including a first conductive semiconductor layer, an active layer, and a second conductive semiconductor layer, and having a first surface comprising a surface of the first conductive semiconductor layer, and a second surface opposite the first surface, a first electrode and a second electrode disposed on the second surface of the light emitting structure, and connected to the first conductive semiconductor layer and the second conductive semiconductor layer, respectively, an insulating layer at least partially covering the second surface of the light emitting structure, the first electrode, and the second electrode, a first bonding structure and a second bonding structure disposed on the insulating layer, the first bonding structure being electrically connected to the first electrode and second bonding structure being electrically connected to the second electrode and each of the first bonding structure and the second bonding structure having a patterned surface with a surface roughness of at least one of 0.05 μm or more as an arithmetic mean roughness (Ra) or of 0.5 μm or more as a 10-point average roughness (Rz), and an encapsulant in contact with the patterned surfaces of the first bonding structure and the second bonding structure.

According to another example embodiment, a semiconductor light emitting device package may include: a light emitting diode having opposite first and second surfaces, and comprising first and second semiconductor layers with an active layer there between, a first electrode and a second electrode contacting the second surface of the light emitting structure, and electrically connected to the first conductive semiconductor layer and the second conductive semiconductor layer, respectively, an insulating layer at least partially covering the second surface of the light emitting structure, the first electrode, and the second electrode, first and second metal connectors disposed on the insulating layer, and connected, respectively to the first and second electrodes, and each having at least one rough surface, and an encapsulant disposed to surround the first and second metal connectors, wherein the rough surfaces of the first and second metal connectors increase a surface area of an interface between the metal connectors and the encapsulant thereby increasing adhesion there-between.

According to another example embodiment, a semiconductor light emitting device package may include: a light emitting diode structure having opposite first and second surfaces and first and second semiconductor layers with an active layer therebetween, first and second electrodes contacting the second surface of the light emitting diode structure and electrically connected to the first semiconductor layer and the second semiconductor layer, respectively, an insulating layer at least partially covering the second surface of the light emitting diode structure, the first electrode and the second electrode, first and second metal connectors disposed on the insulating layer and connected, respectively, to the first and second electrodes, and each having at least one rough surface, an encapsulant disposed to surround the first and second metal connectors, wherein the rough surfaces of the first and second metal connectors increase a surface area of an interface between the metal connectors and the encapsulant thereby increasing adhesion there-between.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Figure 1:
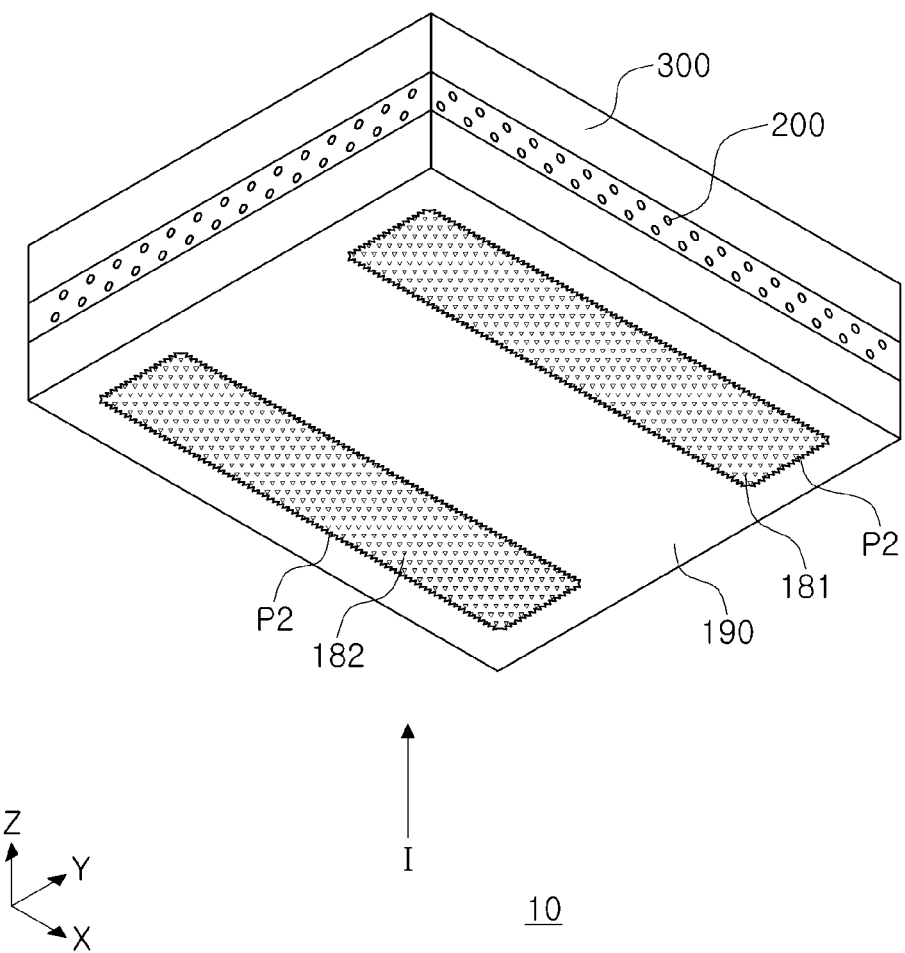
FIG. 1 is a schematic perspective view of a semiconductor light emitting device package according to an example embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identically, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Figure 2:
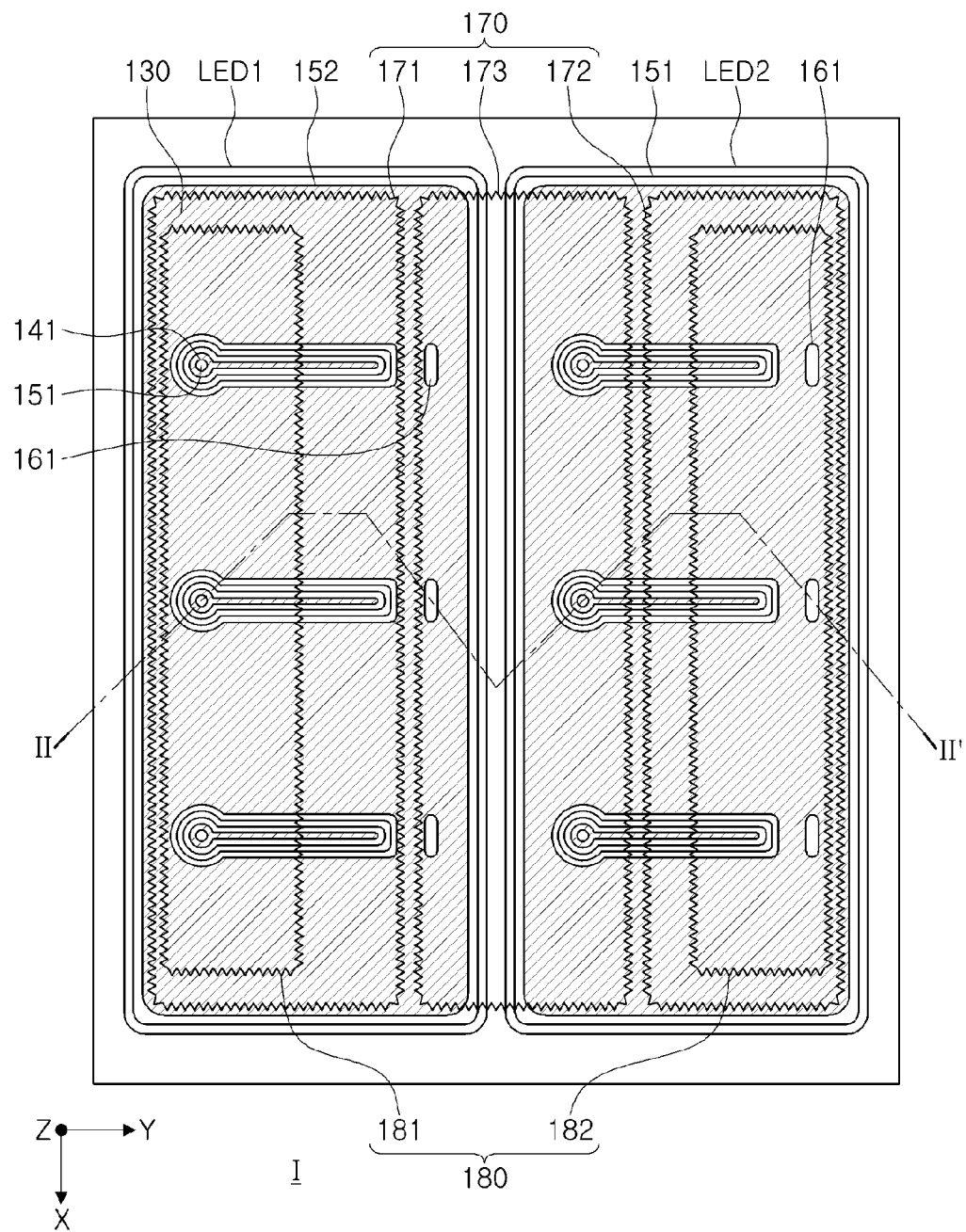
FIG. 2 is a plan view of the semiconductor light emitting device package viewed in direction I of FIG. 1.
Figure 3:
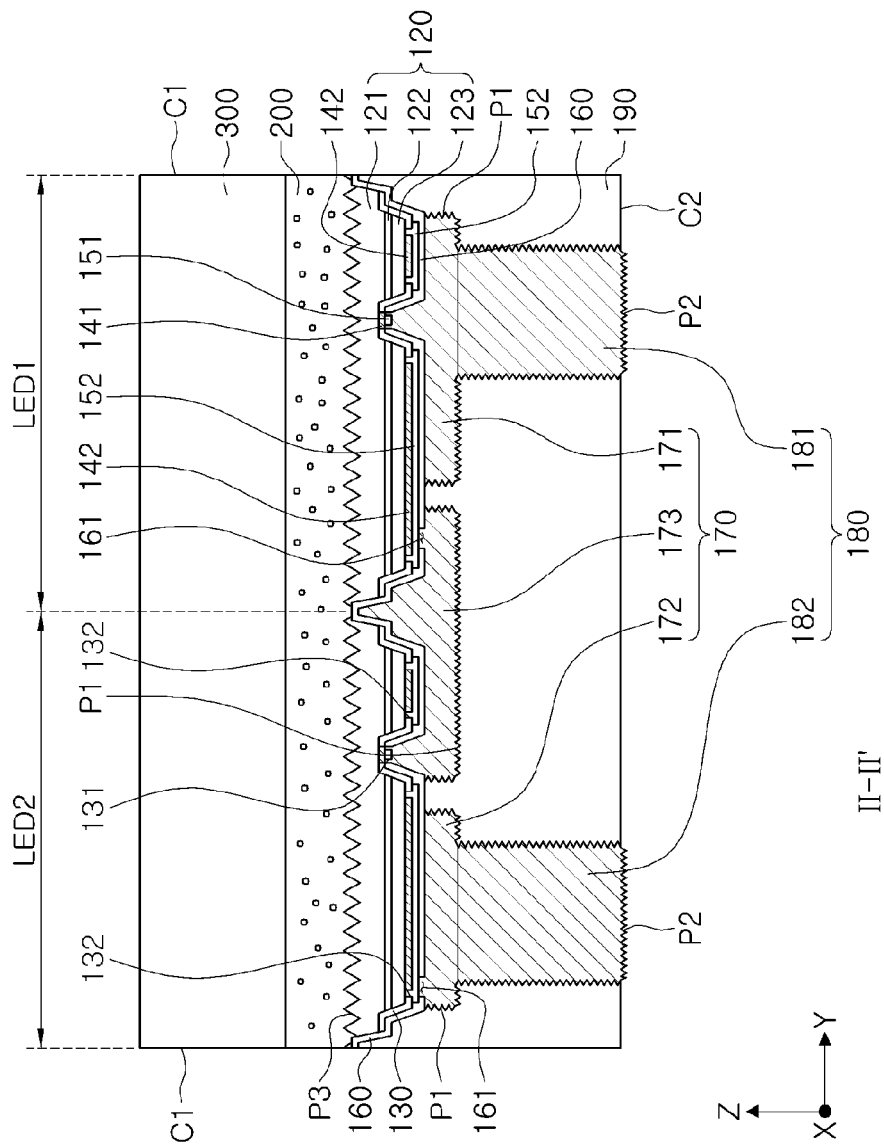
FIG. 3 is a cross-sectional view taken along line II-II' of FIG. 2.

As shown in FIGS. 1 through 3, a semiconductor light emitting device package 10 according to an example embodiment will be described. FIG. 1 is a schematic perspective view of a semiconductor light emitting device package according to an example embodiment; FIG. 2 is a plan view of the semiconductor light emitting device package viewed in direction I of FIG. 1; and FIG. 3 is a cross-sectional view taken along line II-II' of FIG. 2.

As shown in FIGS. 1 through 3, the semiconductor light emitting device package 10 according to an example embodiment may include a light emitting structure 120, a first electrode 141 and a second electrode 142 connected to the light emitting structure 120, first and second insulating layers 130 and 160, a metal pad 170, a bonding pad 180, and an encapsulant 190. Here, the metal pad 170, the bonding pad 180, and the encapsulant 190 may form a bonding structure. The semiconductor light emitting device package 10 according to an example embodiment may be a chip scale package (CSP) or a wafer level package (WLP).

As shown in FIG. 3, the light emitting structure 120 may include a first conductive semiconductor layer 121, an active layer 122, and a second conductive semiconductor layer 123. The light emitting structure 120 may have a first surface formed by the first conductive semiconductor layer 121 and a second surface opposing the first surface. The second surface may have the first and second electrodes 141 and 142, to be described later, disposed thereon. The active layer 122 and the second conductive semiconductor layer 123 may be removed from portions of the light emitting structure 120 to form a mesa region and an etching region in which the first conductive semiconductor layer 121 may be exposed. The first conductive semiconductor layer 121 may have an uneven pattern P3 formed on the first surface thereof in order to improve light extraction efficiency.

The first conductive semiconductor layer 121 may be a nitride semiconductor layer satisfying n-type $In_xAl_yGa_{1-x-y}N$ ($0 \leq x<1$, $0 \leq y \leq 1$, $0 \leq x+y<1$), and an n-type impurity may be silicon (Si), germanium (Ge), selenium (Se), tellurium (Te), or the like. The active layer 122 may have a multiple quantum well (MQW) structure in which quantum well layers and quantum barrier layers are alternately layered on each other. For example, the quantum well layer and the quantum barrier layer may include different compositions of $In_xAl_yGa_{1-x-y}N$ ($0 \leq x \leq 1$, $0 \leq y \leq 1$, $0 \leq x+y \leq 1$). In a certain example embodiment, the quantum well layer may include a composition of $In_xGa_{1-x}N$ ($0<x \leq 1$), and the quantum barrier layer may include GaN or AlGaN. However, the active layer 122 is not limited thereto, and may also have a single quantum well (SQW) structure.

The second conductive semiconductor layer 123 may be a nitride semiconductor layer satisfying p-type $In_xAl_yGa_{1-x-y}N$ ($0 \leq x<1$, $0 \leq y<1$, $0 \leq x+y<1$), and a p-type impurity may be magnesium (Mg), zinc (Zn), beryllium (Be), or the like. The light emitting structure 120 may also be provided as a plurality of light emitting structure 120. In an example embodiment, the light emitting structure 120 may be illustrated, as an example, as having a first light emitting structure LED1 and a second light emitting structure LED2, but is not limited thereto. The light emitting structure 120 may include a single light emitting structure, and may also include three or more light emitting structures.

The first and second electrodes 141 and 142 may be in contact with the first and second conductive semiconductor layers 121 and 123, respectively.

The first and second electrodes 141 and 142 may include the first and second conductive semiconductor layers 121 and 123 and a conductive material having ohmic characteristics stacked in a monolayer or a multilayer structure. The first and second electrodes 141 and 142 may be formed by depositing, for example, at least one of gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), or a transparent conductive oxide (TCO) using sputtering or the like. The first and second electrodes 141 and 142 may be disposed in an identical direction on the second surface opposite the first surface on which the first conductive semiconductor layer 121 may be disposed, based on the light emitting structure 120. Thus, the semiconductor light emitting device package 10 may be disposed on a mounting surface in flip-chip form.

In this case, light emitted from the active layer 122 may be externally emitted via the first conductive semiconductor layer 121.

A first insulating layer 130 may be disposed on a surface of the light emitting structure 120 to cover the active layer 122 exposed to the etching region and the mesa region. The first insulating layer 130 may include a material having basic insulating characteristics, and may be formed using an inorganic or organic material. The first insulating layer 130 may be formed of an epoxy-based insulating resin, may include a silicon oxide or a silicon nitride. For example, the first insulating layer 130 may be formed of $SiO_2$, SiN, $SiO_xN_y$, $TiO_2$, $Si_3N_4$, $Al_2O_3$, TiN, AlN, $ZrO_2$, TiAlN, or TiSiN.

The first insulating layer 130 may have a plurality of openings 131 and 132 disposed on the first and second electrodes 141 and 142, respectively. The openings 131 and 132 may define positions in which the first and second electrodes 141 and 142 may be disposed, respectively.

As illustrated in FIGS. 2 and 3, the first electrode 141 may be in contact with the first conductive semiconductor layer 121 in the etching region, and the second electrode 142 may be in contact with the second conductive semiconductor layer 123 in the mesa region. Further, the first electrode 141 may have a plurality of pads and a plurality of fingers having a width narrower than that of the pads. The pads may be spaced apart from each other. The second electrode 142 may have a shape that covers an upper surface of the second conductive semiconductor layer 123. The second electrode 142 may have a greater surface area than that of the first electrode 141 considering characteristics of the second conductive semiconductor layer 123 having a relatively high level of electrical resistance. The first and second electrodes 141 and 142 may be disposed in the openings 131 and 132 formed by selectively removing portions of the first insulating layer 130 formed on the light emitting structure 120.

A first metal layer 151 and a second metal layer 152 may cover the first electrode 141 and the second electrode 142, respectively, to be electrically connected to the first conductive semiconductor layer 121 and the second conductive semiconductor layer 123, respectively. The first and second metal layers 151 and 152 may be selectively provided, and may also be removed according to an example embodiment.

A second insulating layer 160 may be disposed on the light emitting structure 120 to cover the entirety of the first insulating layer 130 and the first and second metal layers 151 and 152. The second insulating layer 160 may be formed of an epoxy-based insulating resin having basic insulating characteristics, similarly to the first insulating layer 130. According to an example embodiment, the second insulating layer 160 may include the same material as the first insulating layer 130.

The second insulating layer 160 may have a bonding structure disposed thereon, and the bonding structure may include the metal pad 170 and the bonding pad 180.

The metal pad 170 may include a first metal pad 171 and a second metal pad 172, and the first and second metal pads 171 and 172 may be spaced apart from each other on the second insulating layer 160. Further, the first and second metal pads 171 and 172 may be electrically connected to the first and second conductive semiconductor layers 121 and 123, respectively. The metal pad 170 may include a monolayer or a multilayer metal layer as a wiring structure for connecting the first and second electrodes 141 and 142 to the bonding pad 180 that will be described below. The metal pad 170 may include a Cu or Cu/Sn alloy, but is not limited thereto, and may include various types of conductive material which may have a fine uneven pattern formed on a surface thereof using an etchant. The first and second metal pads 171 and 172 may be respectively connected to the first and second metal layers 151 and 152 through a plurality of openings 161 of the second insulating layer 160 in a plurality of regions separated from each other.

Each surface of the first and second metal pads 171 and 172 may have a first fine uneven pattern P1 having a first surface roughness to provide an interface between the encapsulant 190 (to be described below) and the first and second metal pads 171 and 172 may be in contact with each other. Accordingly, an anchor effect between the metal pad 170 and the encapsulant 190 may be increased to improve adhesion between the metal pad 170 and the encapsulant 190, and to increase the peel strength of the encapsulant 190. The first fine uneven pattern P1 may be formed by chemically treating the surface of the metal pad 170, and may have an irregular pattern formed by a chemical treatment. When the metal pad 170 includes Cu, the first fine uneven pattern P1 may be formed using various types of Cu etchant. For example, the first fine uneven pattern P1 may be formed by spraying formic acid, or ferric chloride such as $FeCl_3.6H_2O$ onto the surface of the metal pad 170.

The first surface roughness may be an arithmetic mean roughness (Ra) of 0.05 μm or more, or a 10-point average roughness (Rz) of 0.5 μm or more. When the encapsulant 190 is formed on the metal pad 170 having the first fine uneven pattern P1 having a range of the first surface roughness as identified above, a peel strength of 0.3 Kgf/cm$^2$ or more may be secured. Thus, delamination of the encapsulant 190 due to an impact that may occur in a manufacturing process of the semiconductor light emitting device package 10, or loosening of the encapsulant 190 due to a difference between coefficients of thermal expansion of the metal pad 170 and the encapsulant 190, may be alleviated, thereby increasing reliability of the semiconductor light emitting device package 10. As illustrated in FIG. 3, the first fine uneven pattern P1 may be formed on a lower surface of the metal pad 170, as well as on a lateral surface of the metal pad 170, such that an area of the lower surface may be substantially the same as those of the first and second light emitting structures LED1 and LED2, as illustrated in FIGS. 2 and 3, thereby drastically improving the peel strength of the encapsulant 190.

In an example embodiment, when the light emitting structure 120 includes a plurality of first and second light emitting structures LED1 and LED2, a connecting metal pad 173 may be spaced apart from the first and second metal pads 171 and 172 and between the first and second metal pads 171 and 172. The connecting metal pad 173 may connect, through the second insulating layer 160, the first electrode 141 of one of the first and second light emitting structures LED1 and LED2, for example, a second light emitting structure LED2, to the second electrode 142 of another light emitting structure, for example, a first light emitting structure LED1, adjacent to the one light emitting structure, and thus, the first and second light emitting structures LED1 and LED2 may be electrically connected to each other.

The bonding pad 180 may include a first bonding pad 181 and a second bonding pad 182, and the first and second bonding pads 181 and 182 may be disposed on the first and second metal pads 171 and 172, respectively. The first and second bonding pads 181 and 182 may be parts of the semiconductor light emitting device package 10 bonded to a circuit board by soldering when the semiconductor light emitting device package 10 is mounted on the circuit board, and may be connected to the first and second conductive semiconductor layers 121 and 123, respectively, to apply current supplied through the bonding pad 180 to the first and second conductive semiconductor layers 121 and 123. The bonding pad 180 may be formed of the same material as the first and second metal pads 171 and 172, and may have a surface with a second fine uneven pattern P2 so as to have a second surface roughness. The second fine uneven pattern P2 may be formed using the same process as that of forming the first fine uneven pattern P1 described above, and may be formed to have substantially the same surface roughness as the first fine uneven pattern P1. However, the second fine uneven pattern P2 is not limited thereto, and may also be formed to have a different surface roughness from that of the first fine uneven pattern P1. According to an example embodiment, the second fine uneven pattern P2 formed on each of exposed portions of the first and second bonding pads 181 and 182 may be removed along with a portion of the encapsulant 190 by using a selective removal process, such as grinding. The effect of the second fine uneven pattern P2 may be equal to that of the first fine uneven pattern P1 described above, and a detailed description of the effect of the second fine uneven pattern P2 will be omitted.

Figure 4:
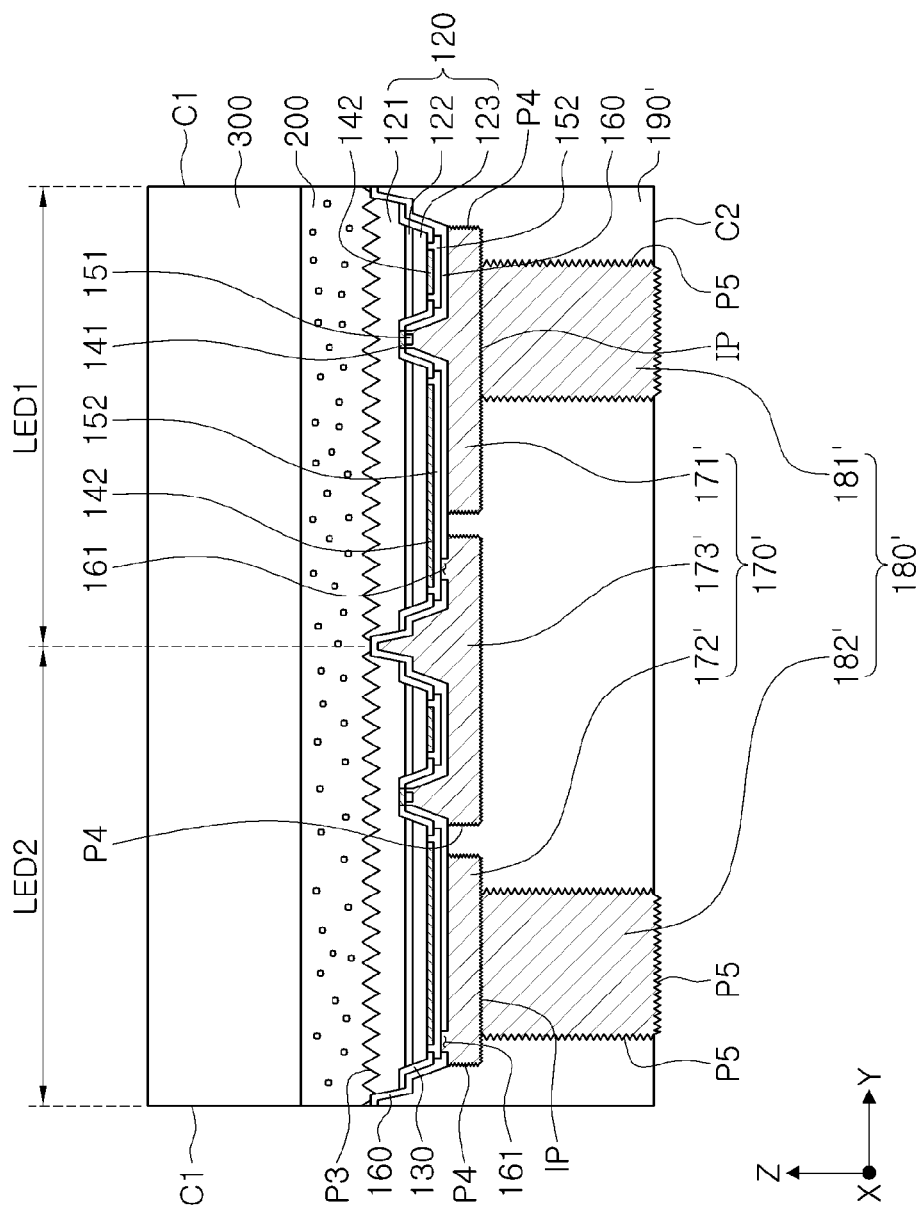
FIG. 4 is a modification of FIG. 3.

As illustrated in FIG. 4, a first surface roughness of a first fine uneven pattern P4 and a second surface roughness of a second fine uneven pattern P5 formed on a metal pad 170' and a bonding pad 180', respectively, may be different from each other. For example, the first fine uneven pattern P4 may be formed on each surface of a first metal pad 171', a second metal pad 172', and a connecting metal pad 173', and then, a first bonding pad 181' and a second bonding pad 182' may be formed, and only surfaces of the first and second bonding pads 181' and 182' may be selectively etched, thereby forming the first fine uneven pattern P4 and the second fine uneven pattern P5 having different surface roughness. Further, a fine uneven pattern may also be formed on a contact surface IP between the metal pad 170' and the bonding pad 180'.

As shown in FIGS. 3 and 4, a wavelength converter 200 and a protection layer 300 may be disposed on an upper surface of the light emitting structure 120. The wavelength converter 200 may be formed to have a sheet shape having a certain thickness, may remain semi-cured at room temperature, and may be a film formed by dispersing a material, such as a phosphor, in a B-stage material of which a phase may be changed to a malleable level when heated. The phosphor may be a garnet-based phosphor, such as YAG, TAG, or LuAG, a silicate-based phosphor, a nitride-based phosphor, a sulfide-based phosphor, or an oxide-based phosphor, and may include a single type of phosphor or multiple types of phosphor mixed at a predetermined ratio. Further, quantum dots (QD) (which may include such phosphor) may be used as the wavelength converter 200. Here, the QD's may replace phosphor (not formed with QD's), or may be mixed with a phosphor that is not formed as part of QD's. A resin used in the wavelength converter 200 may be an epoxy resin or a silicone resin that may satisfy properties, such as high levels of adhesion, high light transmittance, high heat resistance, a high refractive index, and good moisture resistance. In order to secure a high level of adhesion, an additive contributing to an improvement in adhesion, for example, a silane-based material, may be employed.

Also as shown in FIGS. 3 and 4, the encapsulant 190 may cover the metal pad 170 and the bonding pad 180 forming a bonding structure. Further, the encapsulant 190 may cover the light emitting structure 120. The encapsulant 190 may have a flat surface C2 allowing one surfaces of the first and second bonding pads 181 and 182 to be exposed. The encapsulant 190 may have a high Young's modulus in order to stably support the first and second light emitting structures LED1 and LED2. Further, the encapsulant 190 may include a material having a high level of thermal conductivity in order to effectively emit heat generated by the first and second light emitting structures LED1 and LED2. For example, the encapsulant 190 may include a material including an epoxy resin or a silicone resin. Further, the encapsulant 190 may include light-reflective particles reflecting light. The light-reflective particle may be a titanium dioxide ($TiO_2$) or an aluminum oxide ($Al_3O_3$) particle, but is not limited thereto.

A process of manufacturing the semiconductor light emitting device package 10 of FIG. 1 will now be described. FIGS. 5 through 15 are schematic cross-sectional views illustrating a process of manufacturing the semiconductor light emitting device package 10 of FIG. 1. In FIGS. 5 through 15, the same reference numerals as illustrated in FIGS. 1 through 3 denote the same members, and repeated descriptions thereof will be omitted.

Figure 5:
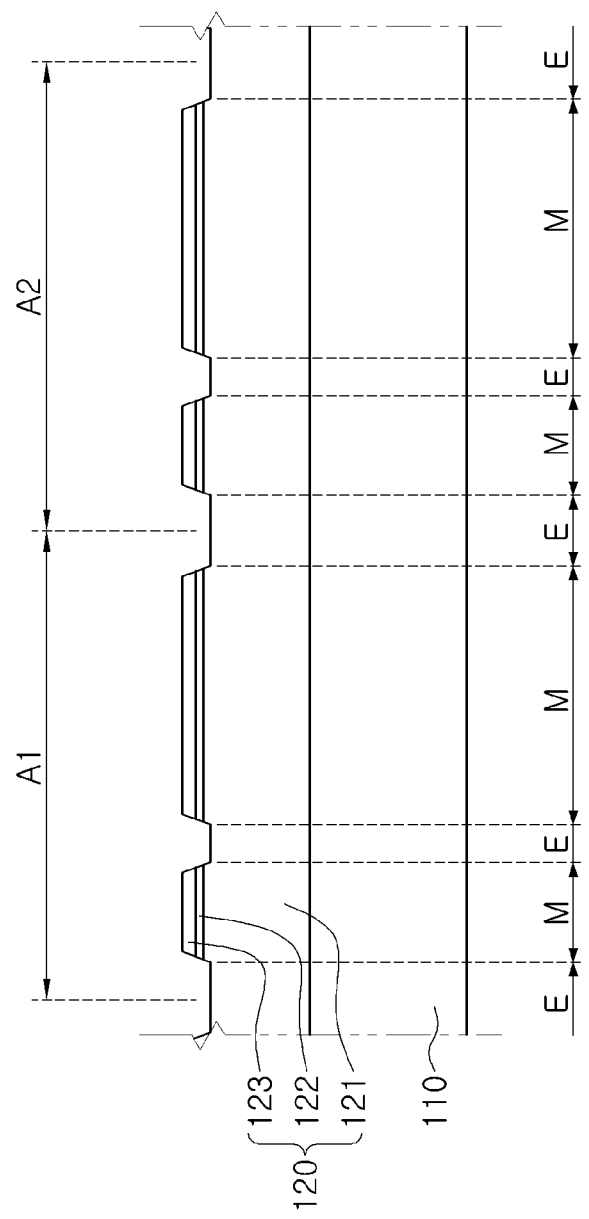
FIGS. 5 through 15 are schematic cross-sectional views illustrating a process of manufacturing the semiconductor light emitting device package of FIG. 1.

As shown in FIG. 5, the light emitting structure 120 may be formed by sequentially growing the first conductive semiconductor layer 121, the active layer 122, and the second conductive semiconductor layer 123 on a substrate 110 in an epitaxial growth manner, and portions of the second conductive semiconductor layer 123, the active layer 122, and the first conductive semiconductor layer 121 may be etched so as to expose at least a portion of the first conductive semiconductor layer 121. Accordingly, an etching region E and a plurality of mesa regions M partially partitioned by the etching region E may be formed. In an example embodiment, two light emitting structures A1 and A2 are formed.

The substrate 110 may be sapphire, SiC, Si, $MgAl_2O_4$, MgO, $LiAlO_2$, $LiGaO_2$, or GaN. The substrate 110 and the first conductive semiconductor layer 121 may have a buffer layer disposed therebetween. The buffer layer may have a composition of $In_xAl_yGa_{1-x-y}N$ (0≤x≤1, 0≤y≤1). For example, the buffer layer may be formed at a low temperature from 500° C. to 600° C., and may be intentionally undoped GaN, AlN, AlGaN, or InGaN. If necessary, the buffer layer may also be formed by combining a plurality of layers or gradually changing compositions thereof.

Figure 6:
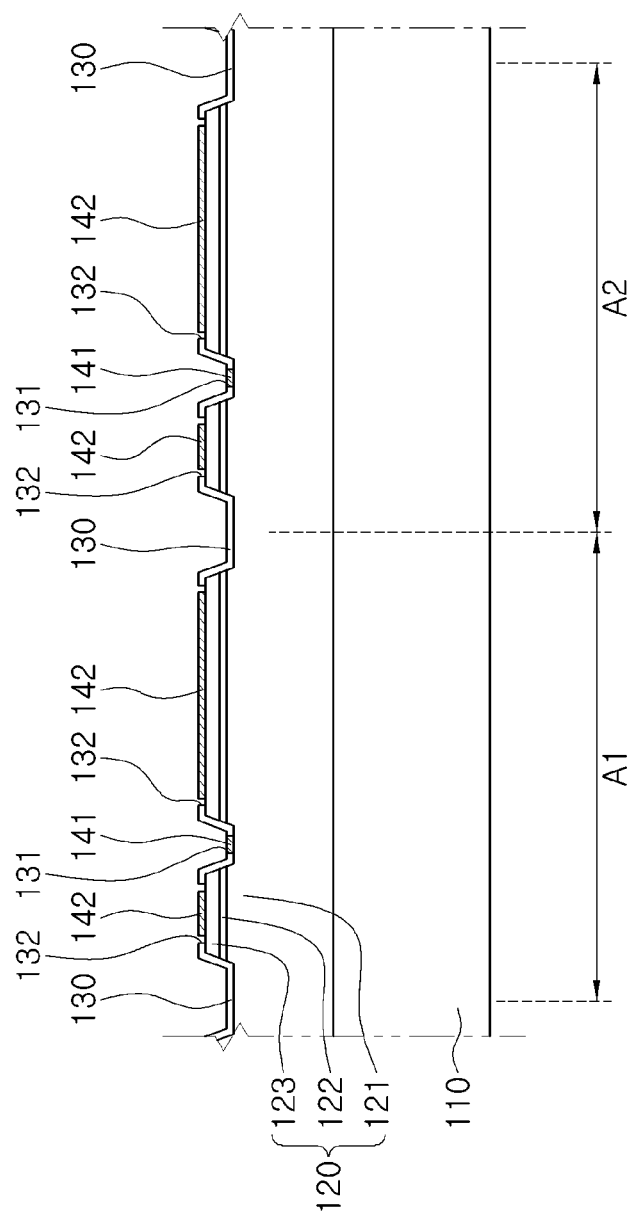

As shown in FIG. 6, the first insulating layer 130 may be formed by depositing an insulating material on the light emitting structure 120, the openings 131 and 132 exposing the first and second conductive semiconductor layers 121 and 123 may be formed by etching the portions of the first insulating layer 130, and then, conductive metals may be deposited in the formed openings 131 and 132, respectively, to form the first and second electrodes 141 and 142.

Figure 7:
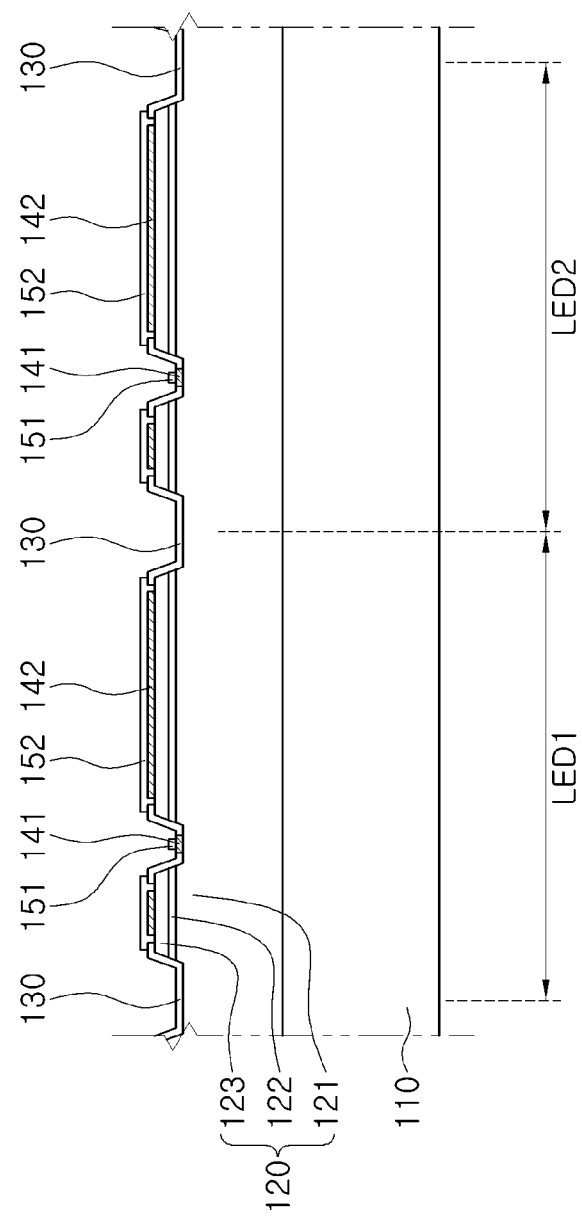

As shown in FIG. 7, the first and second light emitting structures LED1 and LED2 may be formed by depositing conductive metals on the first and second electrodes 141 and 142, respectively, so as to form the first and second metal layers 151 and 152.

Figure 8:
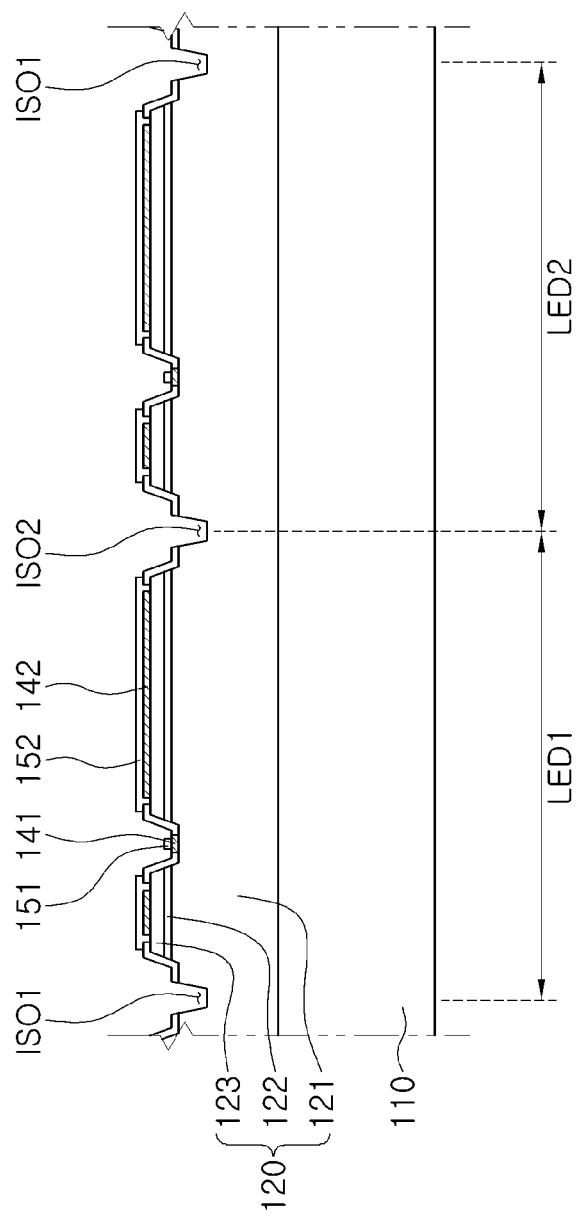

As shown in FIG. 8, a light emitting structure isolation region ISO1 and a device isolation region ISO2 exposing portions of the first conductive semiconductor layer 121 may be formed by etching portions of the light emitting structure 120.

Figure 9:
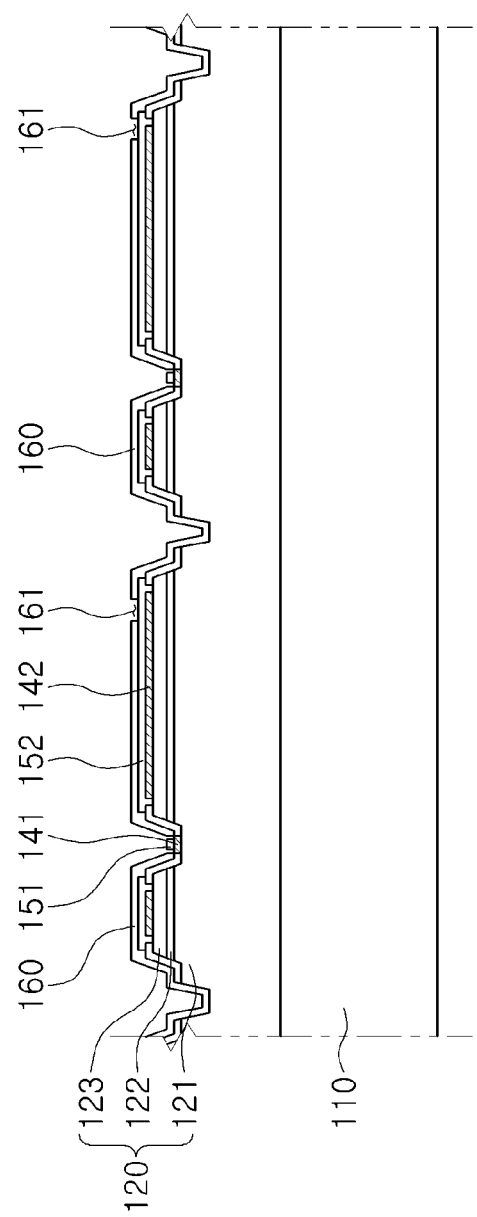

As shown in FIG. 9, the second insulating layer 160 may be formed by depositing an insulating material to cover the first and second metal layers 151 and 152, and the openings 161 exposing the first and second metal layers 151 and 152 may be formed by etching the portions of the second insulating layer 160.

Figure 10:
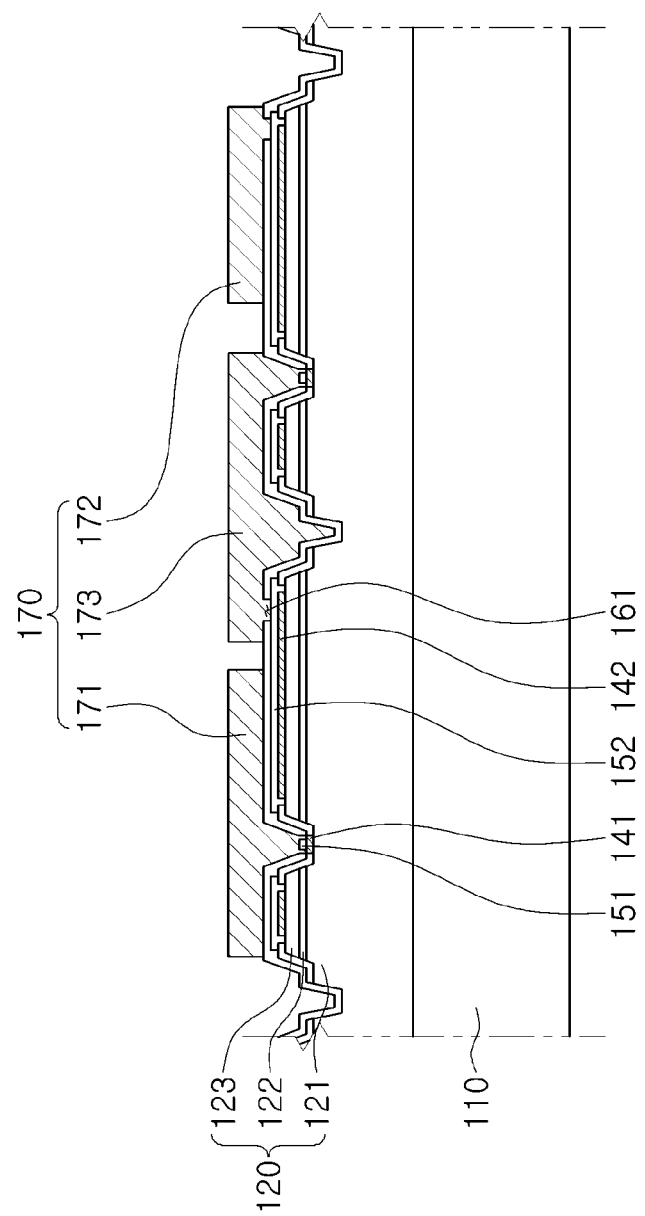

As shown in FIG. 10, the first and second metal pads 171 and 172 and the connecting metal pad 173 may be formed on the second insulating layer 160. The first and second metal pads 171 and 173 and the connecting metal pad 173 may be formed by using a plating process using a seed layer. The first and second metal pads 171 and 172 may be spaced apart from each other such that they may not be electrically disconnected from each other. Each of the first and second metal pads 171 and 173 and the connecting metal pad 173 may be formed of Cu, but is not limited thereto, and may be formed of a conductive material, other than Cu.

Figure 11:
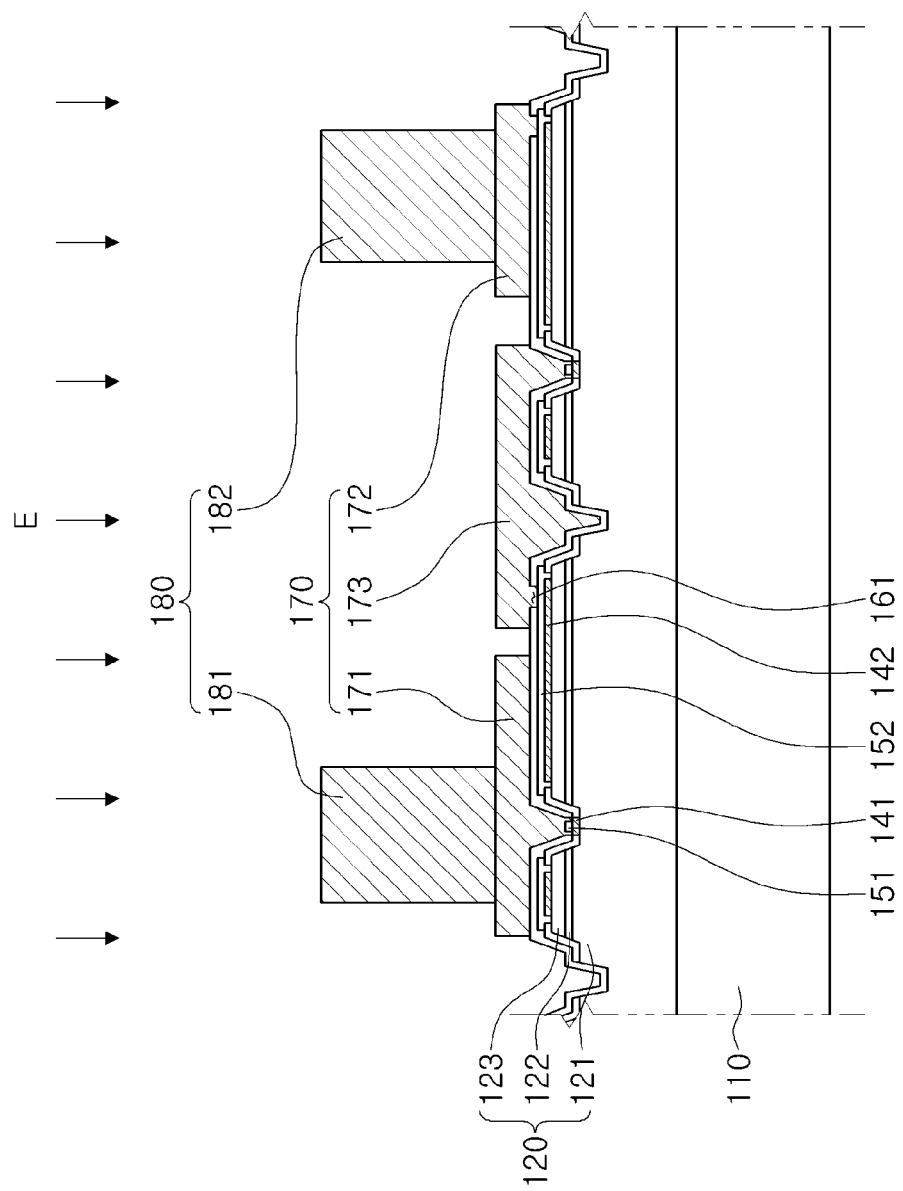

As shown in FIG. 11, the first and second bonding pads 181 and 182 may be formed on the first and second metal pads 171 and 172, respectively. The first and second bonding pads 181 and 182 may be formed by using a plating process. The first and second bonding pads 181 and 182 may be formed of the same material as the first and second metal pads 171 and 172.

In order to conduct the plating process, a photoresist pattern may be formed to define regions in which the first and second metal pads 171 and 172 are to be formed, or regions in which the first and second bonding pads 181 and 182 are to be formed. The photoresist pattern may be removed by using a strip process after completion of the plating process.

Figure 12:
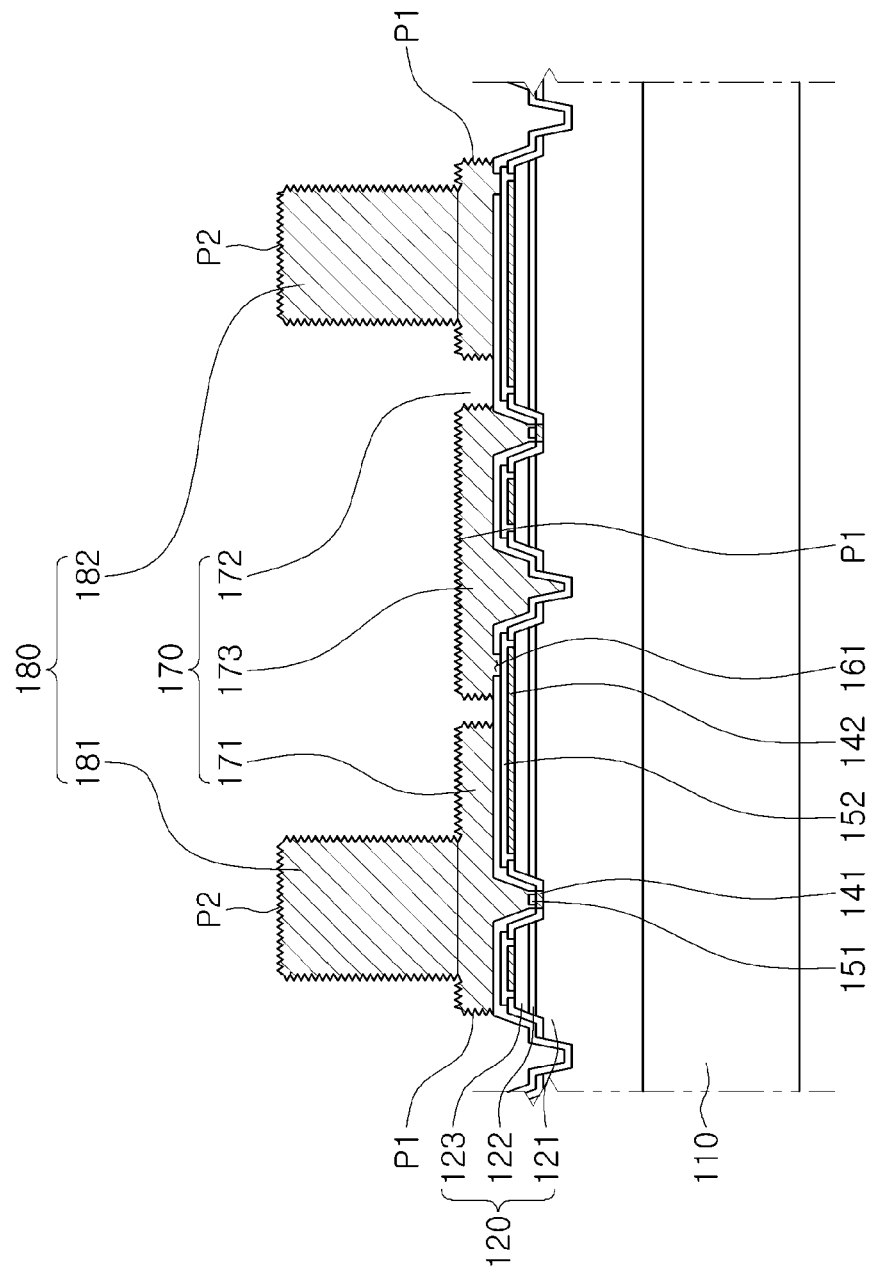

As shown in FIGS. 11 and 12, the first and second fine uneven patterns P1 and P2 may be formed by spraying an etchant E onto the first and second metal pads 171 and 172 and the connecting metal pad 173. When each of the first and second metal pads 171 and 172 and the connecting metal pad 173 are formed of Cu, various types of Cu etchant may be used.

For example, the first and second fine uneven patterns P1 and P2 may be formed by spraying an etchant, such as formic acid, onto the surfaces of the first and second bonding pads 181 and 182 at a pressure of 0.15 Mpa to 0.2 Mpa at a temperature from 20° C. to 40° C.

Figure 13:
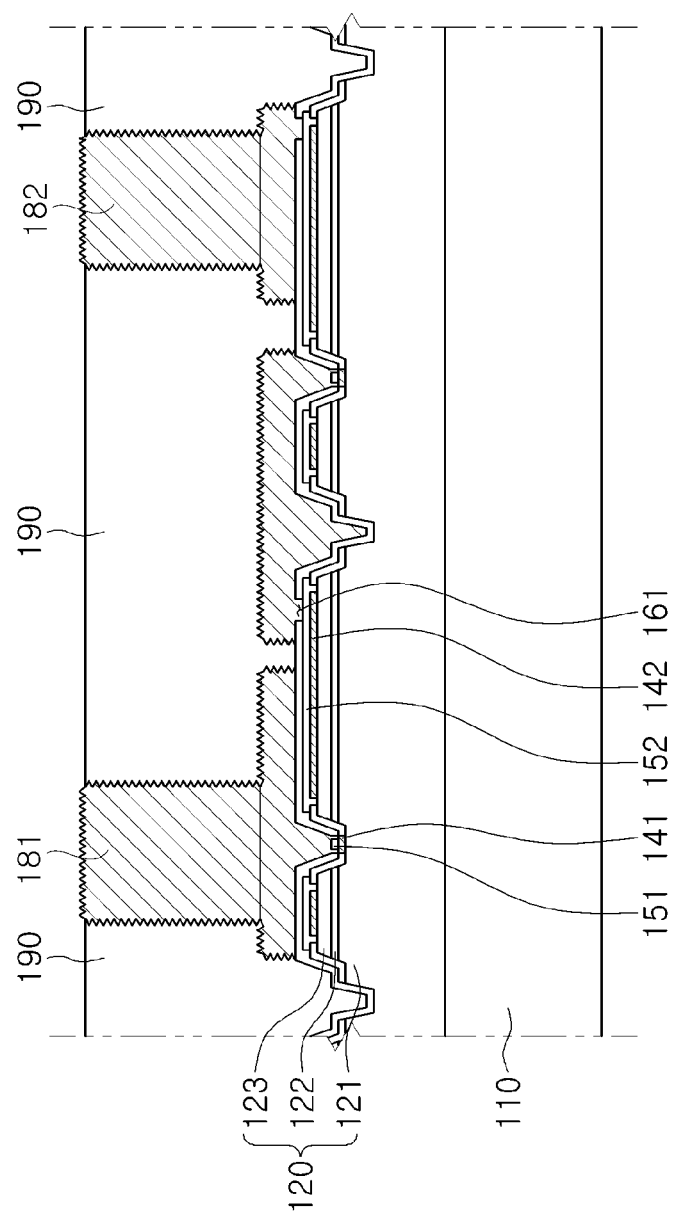

As shown in FIG. 13, the encapsulant 190 encapsulating the first and second metal pads 171 and 172 and the first and second bonding pads 181 and 182 may be formed.

The encapsulant 190 may be formed using a process of applying an encapsulant to the first and second bonding pads 181 and 182 to cover the first and second bonding pads 181 and 182 to upper portions thereof, and using a process of exposing end portions of the first and second bonding pads 181 and 182 by using a flattening process, such as grinding.

Figure 14:
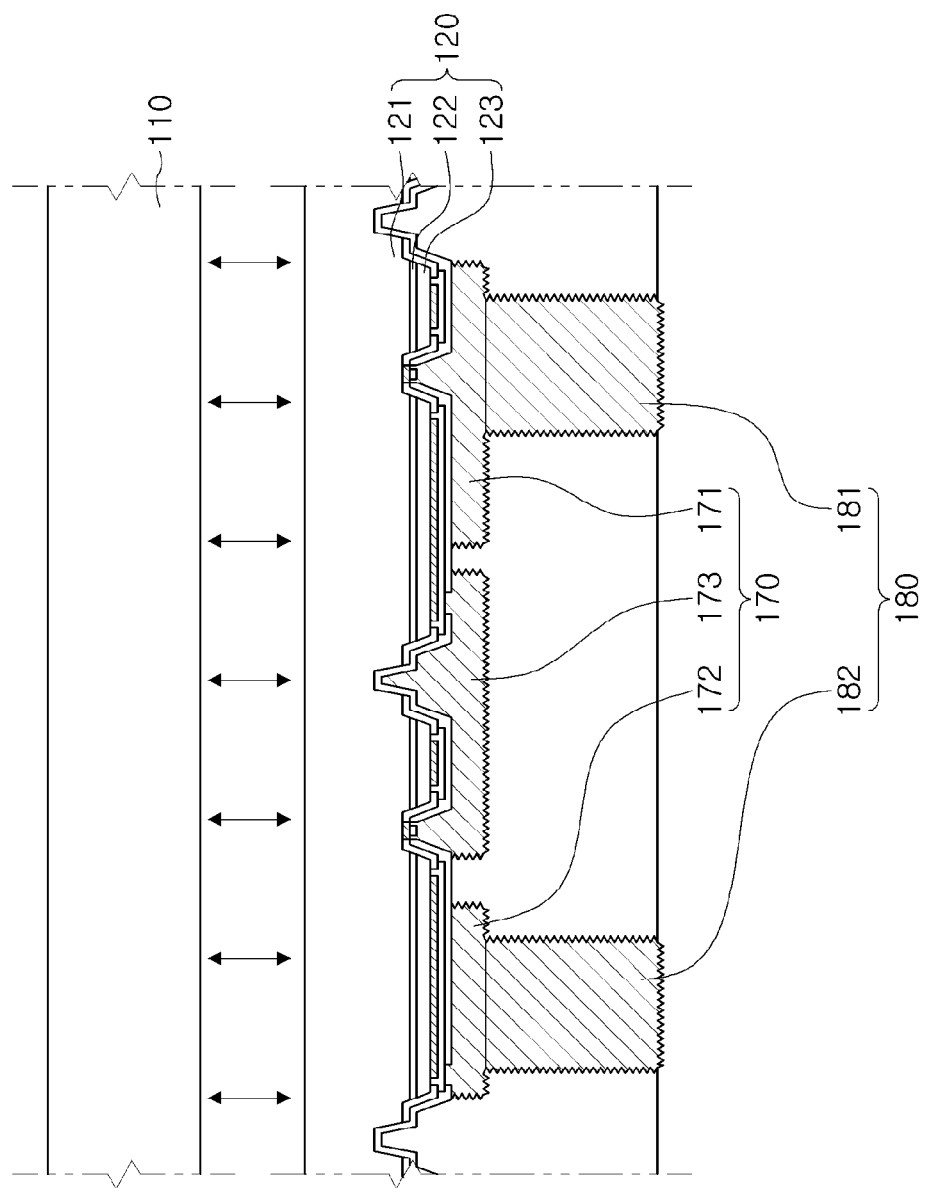

As shown in FIG. 14, a process of removing the substrate 110 such that the first conductive semiconductor layer 121 may be exposed may be conducted. A support substrate may be attached to the encapsulant 190. When the substrate 110 is a transparent substrate such as sapphire, the substrate 110 may be isolated from the light emitting structure 120 by using a laser lift-off (LLO) process. A laser used in the LLO process may be at least one of a 193 nm excimer laser, a 248 nm excimer laser, a 308 nm excimer laser, a Nd:YAG laser, a He—Ne laser, and an Ar ion laser. Further, when the substrate 110 is an opaque substrate such as an Si substrate, the substrate 110 may be removed by using a process such as grinding or polishing.

Figure 15:
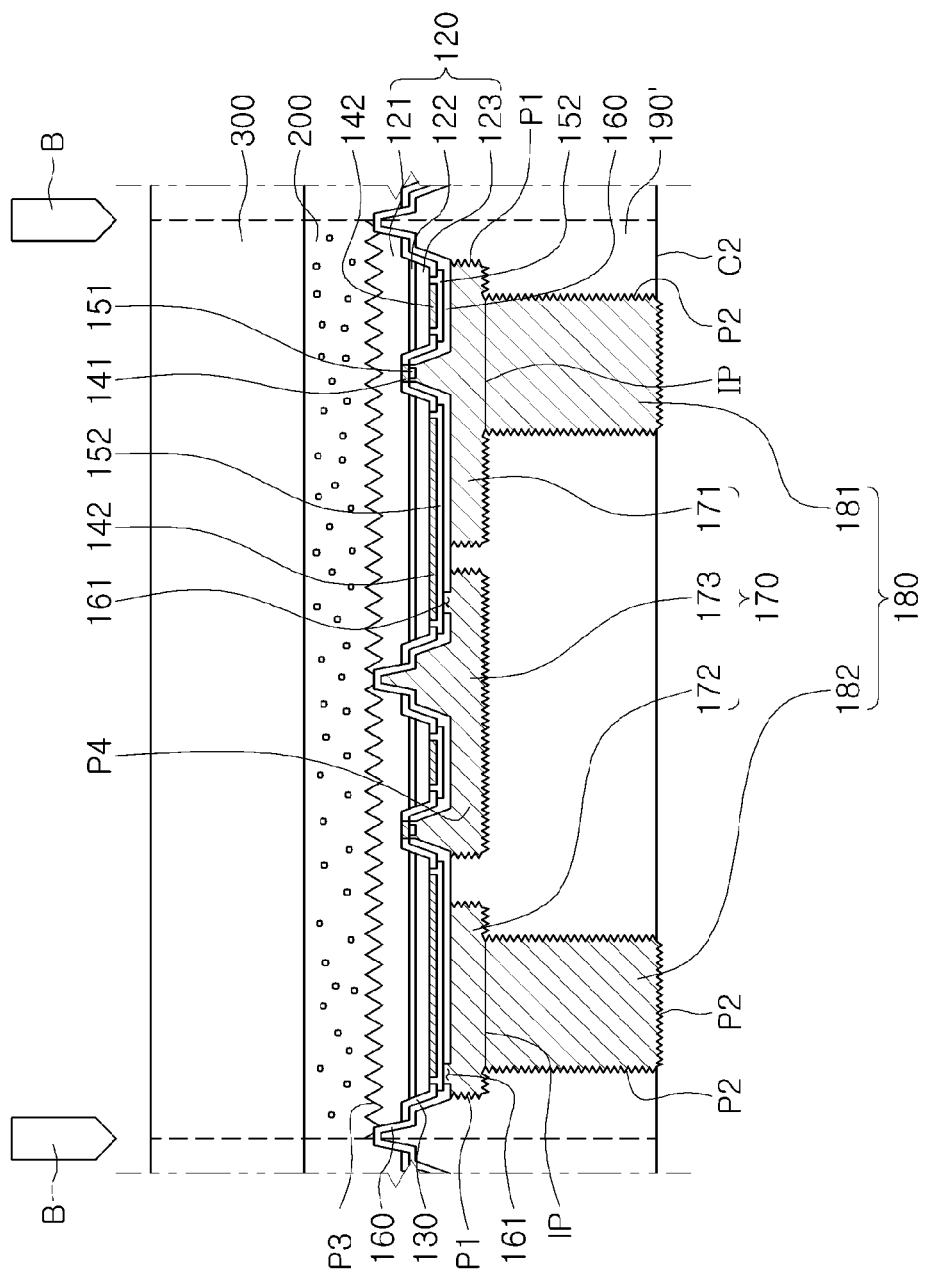

As shown in FIG. 15, the substrate 110 may be removed, and then, the uneven pattern P3 may be formed on the first surface of the first conductive semiconductor layer 121 in order to improve light emission efficiency.

The uneven pattern P3 may be formed by using, for example, a wet etching process using a solution including KOH or NaOH, or a dry etching process using an etching gas including BCl₃. Subsequently, the wavelength converter 200 and the protection layer 300 may be formed on the light emitting structure 120, the light emitting structure 120 may be cut into individual semiconductor light emitting device packages by using a blade B, and the light emitting device package 10 illustrated in FIG. 1 may thus be manufactured.

As set forth above, according to example embodiments, a semiconductor light emitting device package having an encapsulant having improved adhesion properties may be provided by forming a fine uneven pattern having a certain degree of surface roughness on a bonding structure of the semiconductor light emitting device package.

While exemplary embodiments have been shown and described above, it will be apparent to those skilled in the art that modifications and variations could be made without departing from the scope of the present inventive concept as defined by the appended claims.

What is claimed is:

1. A semiconductor light emitting device package comprising:
    a light emitting structure having a sequentially layered structure including a first conductive semiconductor layer, an active layer, and a second conductive semiconductor layer, and having a first surface comprising a surface of the first conductive semiconductor layer, and a second surface opposite the first surface;
    a first electrode and a second electrode disposed on the second surface of the light emitting structure, and connected to the first conductive semiconductor layer and the second conductive semiconductor layer, respectively;
    an insulating layer covering at least parts of the second surface of the light emitting structure, the first electrode, and the second electrode;
    a first metal pad and a second metal pad disposed on the insulating layer, the first metal pad being electrically connected to the first electrode and the second metal pad being connected to the second electrode through respective openings of the insulating layer, each of the first metal pad and the second metal pad having a patterned surface with a surface roughness at least as great as a first surface roughness;
    a first bonding pad and a second bonding pad disposed on the first metal pad and the second metal pad, respectively, and each having a patterned surface with a surface roughness at least as great as a second surface roughness; and
    an encapsulant encapsulating the first bonding pad, the second bonding pad, the first metal pad, and the second metal pad such that portions of the first bonding pad and the second bonding pad are exposed.

2. The semiconductor light emitting device package of claim 1, wherein the patterned surface of the first bonding pad comprises a first patterned side surface and the patterned surface of the second bonding pad comprises a second patterned side surface,
    wherein patterning of the first and second patterned side surfaces is uneven in a vertical direction perpendicular such that, with respect to a cross-sectional view taken in the vertical direction, and
    wherein the patterned surface of each of the first and second patterned side surfaces is uneven and in the vertical direction, the patterned surface of each includes a plurality of protrusions and depressions.

3. The semiconductor light emitting device package of claim 2, wherein, with respect to the cross-sectional view taken in the vertical direction, at least some of the protrusions of the first patterned side surface protrude horizontally and have tips on a first side of a vertical line and depressions formed between the at least some of the protrusions of the first patterned side surface are positioned on a second side of the vertical line, opposite to the first side of the vertical line.

4. The semiconductor light emitting device package of claim 1, wherein the first surface roughness and the second surface roughness are substantially the same as each other.

5. The semiconductor light emitting device package of claim 1, wherein each of the first surface roughness and the second surface roughness is 0.05 μm or more of an arithmetic mean roughness (Ra).

6. The semiconductor light emitting device package of claim 1, wherein each of the first surface roughness and the second surface roughness is 0.5 μm or more of a 10-point average roughness (Rz).

7. The semiconductor light emitting device package of claim 1,
    wherein at each of the first metal pad and the second metal pad comprise a lower surface including a first surface portion and an immediately adjacent second surface portion, wherein the first surface portion is in contact with and directly above a respective one of the first bonding pad and the second bonding pad, and
    wherein the patterned surface of each of the first metal pad and the second metal pad comprise the first surface portion of the first metal pad and the first surface portion of the second metal pad, respectively.

8. The semiconductor light emitting device package of claim 7, wherein the second surface portion is smooth.

9. The semiconductor light emitting device package of claim 1, wherein one surface of the encapsulant and the exposed portions of the first bonding pad and the second bonding pad are at the same vertical level.

10. The semiconductor light emitting device package of claim 1,
    wherein the patterned surfaces of the first and second metal pad and the patterned surfaces of the first and second bonding pad are formed by a process of spraying an etchant on surfaces of the first and second metal pad and the surfaces of the first and second bonding pad at the same time.

11. A semiconductor light emitting device package comprising:
    a light emitting structure having a sequentially layered structure including a first conductive semiconductor layer, an active layer, and a second conductive semiconductor layer, and having a first surface comprising a surface of the first conductive semiconductor layer, and a second surface opposite the first surface;
    a first electrode and a second electrode disposed on the second surface of the light emitting structure, and connected to the first conductive semiconductor layer and the second conductive semiconductor layer, respectively;
    an insulating layer at least partially covering the second surface of the light emitting structure, the first electrode, and the second electrode;
    a first bonding structure and a second bonding structure disposed on the insulating layer, the first bonding structure being electrically connected to the first electrode and second bonding structure being electrically connected to the second electrode and each of the first bonding structure and the second bonding structure having a patterned surface with a surface roughness of at least one of 0.05 μm or more as an arithmetic mean roughness (Ra) or of 0.5 μm or more as a 10-point average roughness (Rz); and an encapsulant in contact with the patterned surfaces of the first bonding structure and the second bonding structure.

12. The semiconductor light emitting device package of claim 11, wherein the light emitting structure is provided as a plurality of light emitting structures, and the first bonding structure and the second bonding structure comprise:

a first metal pad and a second metal pad disposed on the insulating layer, and respectively connected to the first electrode and the second electrode through respective openings of the insulating layer;

a connecting metal pad spaced apart from the first metal pad and the second metal pad and disposed between the first metal pad and the second metal pad, and connecting, through the insulating layer, the first electrode of a first light emitting structure of the plurality of light emitting structures to the second electrode of a second light emitting structure of the plurality of light emitting structures adjacent to the first light emitting structure; and a first bonding pad and a second bonding pad disposed on the first metal pad and the second metal pad, respectively.

13. The semiconductor light emitting device package of claim 12, wherein lower surfaces of the first metal pad, the second metal pad and the connecting metal pad are at the same vertical level.

14. The semiconductor light emitting device package of claim 12, wherein each of the first metal pad, the second metal pad, and the connecting metal pad comprise a patterned surface having substantially the same surface roughness.

15. The semiconductor light emitting device package of claim 12, wherein each of the first metal pad, the second metal pad, and the connecting metal pad comprises a material having the same composition.

16. A semiconductor light emitting device package comprising:

a light emitting diode structure having opposite first and second surfaces, and comprising first and second semiconductor layers with an active layer there between;

a first electrode and a second electrode contacting the second surface of the light emitting diode structure, and electrically connected to the first semiconductor layer and the second semiconductor layer, respectively;

an insulating layer at least partially covering the second surface of the light emitting structure, the first electrode, and the second electrode;

first and second metal connectors disposed on the insulating layer, and connected, respectively to the first and second electrodes, and each having at least one rough surface; and an encapsulant disposed to surround the first and second metal connectors, wherein, with respect to a vertical cross section, a surface length of each of the rough surfaces of the first and second metal connectors between a top surface of each of the first and second metal connectors where the encapsulant contacts and a bottom surface of each of the first and second metal connectors where the insulating layer contacts is greater than a corresponding surface length of each of surfaces each having a linear surface length between the top surface and the bottom surface, and wherein each of the rough surfaces includes an interface between each of the first and second metal connectors and the encapsulant thereby increasing adhesion therebetween.

17. The semiconductor light emitting device package of claim 16, wherein each of the first and second metal connectors comprises a metal pad connected to a bonding pad which are comprised of a material having the same composition.

18. The semiconductor light emitting device package of claim 16, wherein a plurality of surfaces for each of the first and second metal connectors have rough surfaces.

19. The semiconductor light emitting device package of claim 18, wherein different surfaces of the first and second metal connectors have differing surface roughness.

20. The semiconductor light emitting device package of claim 16, further comprising a phosphor layer disposed on the first semiconductor layer.

* * * * *